United States Patent [19]

Suzuki et al.

[11] 4,249,136
[45] Feb. 3, 1981

[54] PWM SIGNAL POWER AMPLIFIER

[75] Inventors: Tadao Suzuki; Tadao Yoshida, both of Tokyo, Japan

[73] Assignee: Sony Corporation, Tokyo, Japan

[21] Appl. No.: 41,325

[22] Filed: May 22, 1979

[30] Foreign Application Priority Data

May 23, 1978 [JP] Japan ................................ 53-61376

[51] Int. Cl.³ ............................................ H03F 3/217
[52] U.S. Cl. .................................... 330/251; 330/10
[58] Field of Search ...................... 330/10, 207 A, 251

[56] References Cited
U.S. PATENT DOCUMENTS
4,021,745  5/1977  Suzuki et al. .......................... 330/10

*Primary Examiner*—James B. Mullins
*Attorney, Agent, or Firm*—Lewis H. Eslinger; Alvin Sinderbrand

[57] ABSTRACT

A PWM (pulse width modulated) signal power amplifier includes an input terminal supplied with a PWM signal directly, an integrator, a zero-cross switch and a pulse amplifier. A negative feedback circuit is provided between the input of the integrator and the output of the pulse signal amplifier so as to provide a low distortion in spite of the voltage fluctuations in the operating voltage to the pulse amplifier.

6 Claims, 14 Drawing Figures

PWM SIGNAL POWER AMPLIFIER

BACKGROUND OF THE INVENTION

1. Field of the Invention

The present invention relates generally to a PWM signal power amplifier and more directly relates to a PWM signal power amplifier which has a low distortion ratio in spite of fluctuations in the operating voltage.

2. Description of the Prior Art

In the art, it is typical to separate a pre-amplifier from a power amplifier. Recently, one arrangement contemplates that a power amplifier be disposed in the same cabinet as a loudspeaker and to electrically connect the output of a pre-amplifier to the input of the power amplifier in the loudspeaker by a lead wire. As disclosed in the U.S. Pat. No. 4,021,745 entitled "Pulse Width Modulated Signal Amplifier" which is assigned to the same assignee as that of this invention, a PWM signal which is in proportion to the instantaneous amplitude of an audio signal can be obtained with low distortion.

In the above, a PWM modulator is provided together with the pre-amplifier and that the output therefrom is transmitted through, for example, an optical fiber or the like, which exhibits less transmission loss, to the input of the power amplifier provided in the loudspeaker. In this case, it is desired that as a power amplifier for the PWM signal such an amplifier be used which is not deteriorated in its distortion characteristic particularly in the presence of fluctuation of a power supply voltage. However, up to now there has not been provided a satisfactory power amplifier for such a PWM signal.

OBJECTS AND SUMMARY OF THE INVENTION

Accordingly, an object of the invention is to provide a PWM signal power amplifier free from the defect encoundered in the prior art PWM signal power amplifier which is.

Another object of the invention is to provide a PWM signal power amplifier in which an input PWM signal is directly power-amplified.

A further object of the invention is to provide a PWM signal power amplifier which is not deteriorated in distortion ratio in the presence of fluctuation of power supply voltage.

In accordance with an aspect of the present invention, a PWM signal power amplifier is provided, which includes a signal input circuit for supplying a pulse width modulated signal to be power-amplified, an integrating circuit having input and output terminals, the input terminal being supplied with the pulse width modulated signal from the signal input circuit, a zero-cross switching circuit having an input connected to the output terminal of the integrating circuit and an output, a pulse amplifying circuit having an input connected to the output of the zero-cross switching circuit and an output, a low pass filter connected to the output of the pulse amplifying circuit and having an output to which a load is connected, and a negative feedback circuit connected between the output of the pulse amplifying circuit and the input terminal of the integrating circuit.

Other objects, features and advantages of the present invention will be apparent from the following description taken in conjunction with the accompanying drawings in which like references designate the same elements.

DESCRIPTION OF THE PREFERRED EMBODIMENT

In order to better understand the present invention, a prior art PWM signal power amplifier first will be described with reference to FIG. 1 which is an audio output amplifier for a PWM signal.

Figure 1:
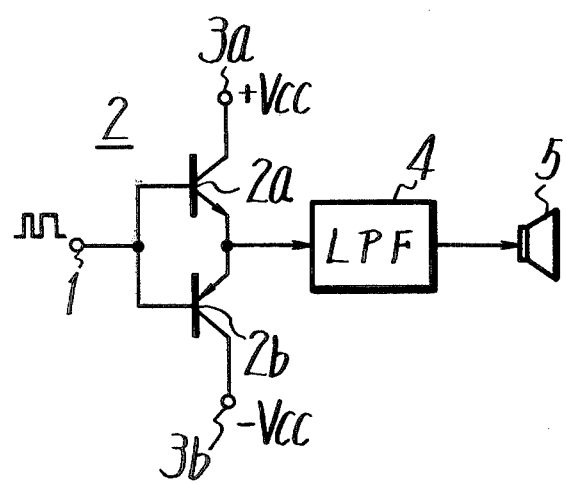
FIG. 1 is a schematic circuit diagram showing a prior art PWM signal power amplifier.

In the prior art PWM signal power amplifier shown in FIG. 1, reference 1 designates an input terminal to which a PWM signal of an audio signal to be power-amplified is applied. This signal input terminal 1 is connected to the bases of an NPN-type transistor 2a and a PNP-type transistor 2b which form a PWM signal amplifier 2. The collector of the transistor 2a is connected to a power supply terminal 3a which is supplied with a positive DC voltage $+Vcc$, and the collector of the transistor 2b is connected to a power supply terminal 3b which is supplied with a negative DC voltage $-Vcc$ whose absolute value is same as that of the positive DC voltage $+Vcc$. The emitters of the transistors 2a and 2b are connected together through a low pass filter 4 to a speaker 5.

With the prior art PWM signal power amplifier shown in FIG. 1, when the absolute value of the DC voltages applied to the power supply terminals 3a and 3b is constant, the amplifier operates normally. However, if the absolute value of the DC voltages fluctuates, the area of a rectangular signal at the positive or negative side, which rectangular signal appears at the output side of the PWM signal amplifier 2 i.e. the connection point between the emitters of transistors 2a and 2b, also fluctuates. As a result, the audio signal, which is an average signal of the rectangular signal obtained at the output side of the low pass filter 4, is distorted. Therefore, if this PWM signal power amplifier is employed as an output signal amplifier, the power voltage fluctuation caused by the variation of current or voltage drop across the ON-resistance of a switching element becomes a significant problem.

Next, an example of the PWM signal power amplifier according to the present invention, which is free from the above defect, will be described with reference to FIG. 2 in which the references corresponding to those of FIG. 1 designate the same elements and their detailed description will be omitted.

Figure 2:
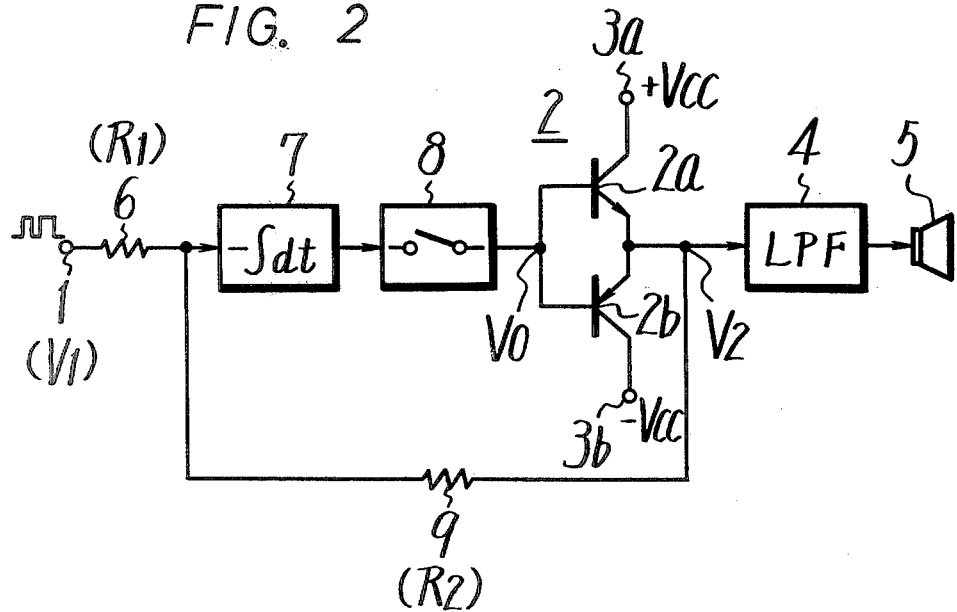
FIG. 2 is a schematic circuit diagram showing an example of the PWM signal power amplifier according to the present invention.

In the example of the invention shown in FIG. 2, a signal input terminal 1, which is supplied with a PWM signal of, for example, an audio signal to be power-amplified, is connected through a resistor 6, whose resistance value is R1, to the input side of an integrating circuit, for example, Miller integrator 7. In this example, this Miller integrator 7 is formed as an inverse phase amplifier. The output signal from the Miller integrator 7 is fed to the input side of a zero-cross switching circuit 8 whose output signal is changed from one voltage level $-V_0$ to the other voltage level $+V_0$ when the voltage level of the signal supplied thereto becomes zero. The PWM signal appearing at the output side of zero-cross switching circuit 8 is applied to the bases of the transistors 2a and 2b which form the PWM signal amplifier 2. The output signal from the PWM signal amplifier 2 is applied through the low pass filter 4 to the speaker 5. The connection point between the emitters of transistors 2a and 2b, that is, the output of the amplifier 2 is connected through a resistor 9, whose resistance value is R2, to the input of the Miller integrator 7. In this case, if it is assumed that the maximum voltage level of the PWM signal applied to the signal input terminal 1 is taken as V1 and the maximum voltage level of the PWM signal obtained at the output of the PWM signal amplifier 2 (which is approximately equal to that of the power supply voltage Vcc) is taken as V2, respectively, and if the following condition is satisfied, $$V1/R1 > V2/R2$$

the modulation degree can be selected high.

Figure 3A:
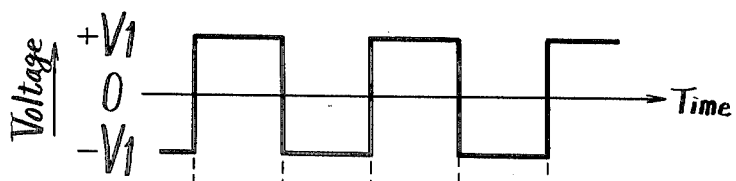
FIGS. 3A to 3G and FIGS. 4A to 4E are waveform diagrams used for explaining the operation of the example of the invention shown in FIG. 2.
Figure 3B:
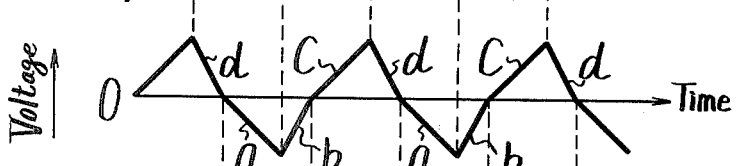

With the PWM signal power amplifier according to the present invention having the construction shown above, when a PWM signal V1 to be power-amplified such as shown in FIG. 3A is applied to the signal input terminal 1, the Miller integrator 7 produces an output signal with the integrated waveform as shown in FIG. 3B. In this case, first to fourth gradients or inclinations a, b, c and d of the integrated waveform are expressed as follows:

$$a = -\left(\frac{V1}{CR1} - \frac{V2}{CR2}\right)$$
$$b = -\left(-\frac{V1}{CR1} - \frac{V2}{CR2}\right)$$
$$c = -\left(-\frac{V1}{CR1} + \frac{V2}{CR2}\right)$$
$$d = -\left(\frac{V1}{CR1} + \frac{V2}{CR2}\right)$$

where C represents the capacitance value of the Miller integrator 7. The above integrated waveform is formed of the first to fourth gradients a, b, c and d, which are repeated in this order, when there are no fluctuations in the voltages V1 and V2. In this case, the gradients have the following relations.

$$|a| = |c| \text{ and } |b| = |d|$$

Figure 3C:
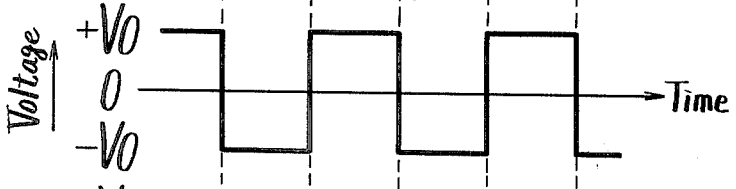
Figure 3D:
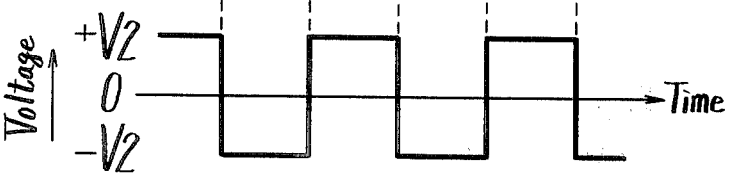

When the integrated waveform shown in FIG. 3B is applied to the zero-cross switching circuit 8, which may be a high gain amplifier, a PWM signal, which is changed to one voltage $-V0$ or $+V0$ at the zero level of the integrated waveform similar to the PWM signal applied to the signal input terminal 1, as shown in FIG. 3C, is developed at the output of the zero-cross swiching circuit 8. The PWM signal from the zero-cross switching circuit 8 is applied to the PWM signal amplifier 2, and at the output of the amplifier 2 there is obtained a PWM signal, which is amplified as in the prior art, as shown in FIG. 3D. This amplified PWM signal is applied through the low pass filter 4 to the speaker 5 whereat it is reproduced as sound.

Figure 3E:
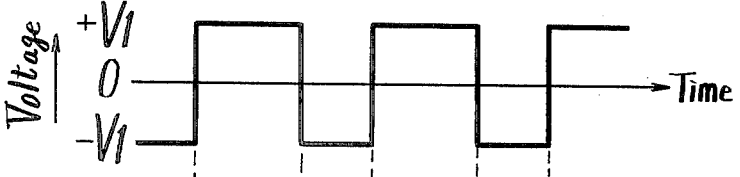
Figure 3F:
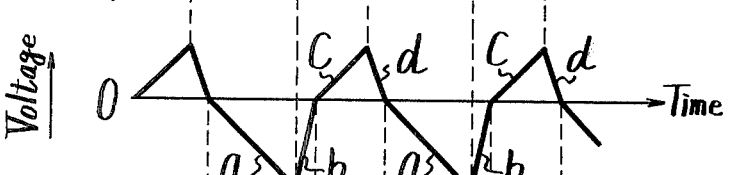
Figure 3G:
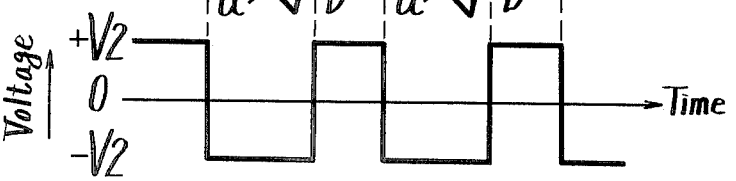

If the pulse width of the PWM signal applied to the signal input terminal 1 is changed as shown in FIG. 3E, the output signal from the Miller integrator 7 exhibits the integrated waveform as shown in FIG. 3F. In this case, the first to fourth gradients a to d of the integrated waveform become gradients or inclinations corresponding to the pulse width of the PWM signal applied to the Miller integrator 7, and hence at the output side of the PWM signal amplifier 2 there is obtained the PWM signal shown in FIG. 3G similar to the above.

Figure 4A:
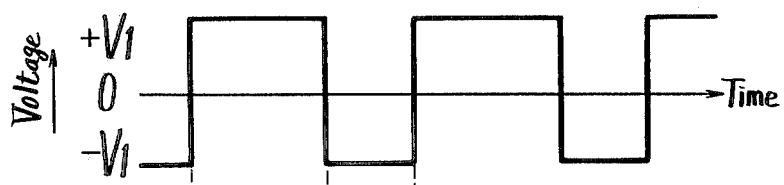
Figure 4B:
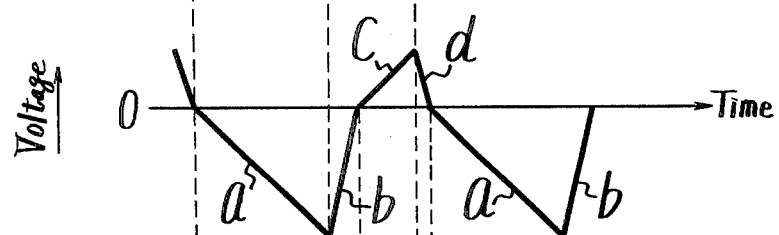
Figure 4C:
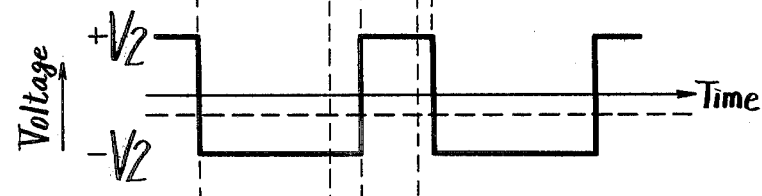

Next, such a case that the power supply voltage fluctuates will be described. Now, the operation of the PWM signal power amplifier in the event is considered that the PWM signal shown in FIG. 4A is applied to the signal input terminal 1 Miller integrator 7 produces the integrated waveform shown in FIG. 4B, the PWM signal amplifier 2 produces the amplified PWM signal shown in FIG. 4C by the solid line, and the low pass filter 4 delivers a signal component with an average level of the PWM signal from the amplifier 2 as shown in FIG. 4C by the dotted line. If the voltage applied to the power supply terminal 3b fluctuates to $-(V2 + \Delta V2)$, the first and second gradients a and b of the integrated waveform are changed to a1 and b2 which are expressed as follows:

$$a1 = -\frac{V1}{CR1} + \frac{V2 + \Delta V2}{CR2}$$
$$b1 = \frac{V1}{CR1} + \frac{V2 + \Delta V2}{CR2}$$

In this case, the third and fourth gradients c and d of the integrated waveform are not changed. That is, the following expressions are established, $$|a1| < |a|, |b1| > |b|, |c1| = |c| \text{ and } |d1| = |d|$$

Figure 4D:
Figure 4E:
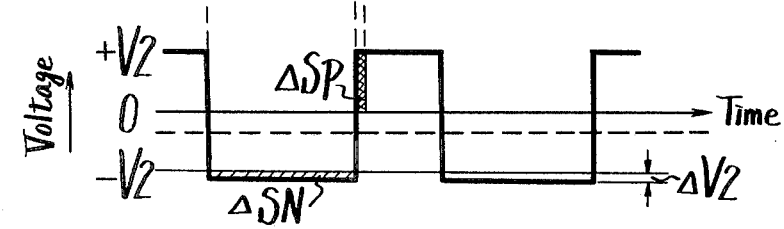

Therefore, the Miller integrator 7 produces the integrated waveform as shown in FIG. 4D, and hence the PWM signal amplifier 2 delivers the PWM signal as shown in FIG. 4E. At this time, the average level of the PWM signal obtained at the output side of the low pass filter 4 becomes the same as the signal component level (constant) indicated by the dotted line in FIG. 4C because the resultant increased area $\Delta SP$ (refer to the double hatched portion in FIG. 4E) at the positive side of the PWM signal is cancelled by an increased area $\Delta SN$ (refer to the hatched portion in FIG. 4E) at the negative side of the PWM signal. That is, according to the PWM signal power amplifier of the present invention shown in FIG. 2, since negative feedback is applied, distortion in the pulse signal amplifier system which would be caused by power supply voltage fluctuation can be suppressed.

As set forth above, according to the present invention, the PWM signal is directly applied to the signal input terminal to be power-amplified, and also distortion in the output signal caused by the power supply voltage fluctuation can be improved.

It will be apparent that many modifications and variation could be effected by one skilled in the art without departing from the spirit or scope of the novel concepts of the present invention, so that the spirit or scope of the invention should be determined by the appended claims only.

We claim as our invention:

1. A PWM signal power amplifier comprising:
   (a) signal input means for supplying a pulse width modulated signal to be power-amplified;
   (b) integrating means having input and output terminals, said input terminal being supplied with the pulse width modulated signal from said signal input means;

(c) zero-cross switching means having an input connected to the output terminal of said integrating means and an output;

(d) pulse amplifying means having an input connected to the output of said zero-cross switching means and an output;

(e) low pass filter means connected to the output of said pulse amplifying means and having an output to which a load is connected; and (f) negative feedback means connected between the output of said pulse amplifying means and the input terminal of said integrating means.

2. A PWM signal power amplifier according to claim 1, in which said signal input means supplies a signal current to the input of said integrating means through a first resistor.

3. A PWM signal power amplifier according to claim 2, in which said negative feedback means includes a second resistor for supplying feedback current to the input of said integrating means.

4. A PWM signal power amplifier according to claim 3, in which the signal current of said supplied pulse width modulated signal is larger than said feedback current so as to provide a high modulation ratio.

5. A PWM signal amplifier according to claim 4, in which said pulse amplifying means comprises:

(a) DC voltage source means having first and second DC voltage terminals;

(b) a first switching transistor having a control electrode and a pair of output electrodes, the pair of output electrodes being connected between the first DC voltage terminal of said DC voltage source means and the input of said low pass filter means;

(c) a second switching transistor having a control electrode and a pair of electrodes, the pair of output electrodes being connected between the second DC voltage terminal of said DC voltage source means and the input of said low pass filter means; and (e) circuit means for connecting the output of said zero-cross switching means to the control electrodes of said first and second switching transistors, respectively.

6. A PWM signal power amplifier according to claim 5, in which said first and second switching transistors comprise complementary NPN and PNP type transistors, respectively, and in which each said control electrode is a base and each said pair of output electrodes are a collector and an emitter, respectively.

* * * * *